United States Patent
Huang et al.

(10) Patent No.: US 8,587,078 B2
(45) Date of Patent: Nov. 19, 2013

(54) INTEGRATED CIRCUIT AND FABRICATING METHOD THEREOF

(75) Inventors: Chien-Hsin Huang, Taichung (TW); Li-Che Chen, Taipei (TW); Ming-I Wang, Taipei (TW); Bang-Chiang Lan, Taipei (TW); Tzung-Han Tan, Taipei (TW); Hui-Min Wu, Hsinchu (TW); Tzung-I Su, Yunlin (TW)

(73) Assignee: United Microelectronics Corp., Hsinchu (TW)

( * ) Notice: Subject to any disclaimer, the term of this patent is extended or adjusted under 35 U.S.C. 154(b) by 453 days.

(21) Appl. No.: 12/754,610

(22) Filed: Apr. 6, 2010

(65) Prior Publication Data
US 2011/0241137 A1    Oct. 6, 2011

(51) Int. Cl.
*H01L 29/84* (2006.01)
*H01L 21/02* (2006.01)

(52) U.S. Cl.
USPC .............. 257/419; 257/254; 257/416; 438/53

(58) Field of Classification Search
USPC .......................................... 257/254, 416, 419
See application file for complete search history.

(56) References Cited

U.S. PATENT DOCUMENTS

| 2006/0105543 | A1* | 5/2006 | Xiao et al. | 438/459 |
|---|---|---|---|---|
| 2009/0243004 | A1* | 10/2009 | Lan et al. | 257/415 |
| 2009/0273043 | A1* | 11/2009 | Lee et al. | 257/416 |
| 2010/0044147 | A1* | 2/2010 | Wang | 181/164 |
| 2011/0068374 | A1* | 3/2011 | Tan et al. | 257/254 |

FOREIGN PATENT DOCUMENTS

TW    200740687    11/2007

* cited by examiner

*Primary Examiner* — Ha Tran T Nguyen
*Assistant Examiner* — Raj R Gupta
(74) *Attorney, Agent, or Firm* — WPAT, PC; Justin King

(57) ABSTRACT

A fabricating method of integrated circuit is provided. During the fabricating process of an interconnecting structure of the integrated circuit, a micro electromechanical system (MENS) diaphragm is formed between two adjacent dielectric layers of the interconnecting structure. The method of forming the MENS diaphragm includes the following steps. Firstly, a plurality of first openings is formed within any dielectric layer to expose corresponding conductive materials of the interconnecting structure. Secondly, a bottom insulating layer is formed on the dielectric layer and filling into the first openings. Third, portions of the bottom insulating layer located in the first openings are removed to form at least a first trench for exposing the corresponding conductive materials. Then, a first electrode layer and a top insulating layer are sequentially formed on the bottom insulating layer, and the first electrode layer filled into the first trench and is electrically connected to the conductive materials.

20 Claims, 9 Drawing Sheets

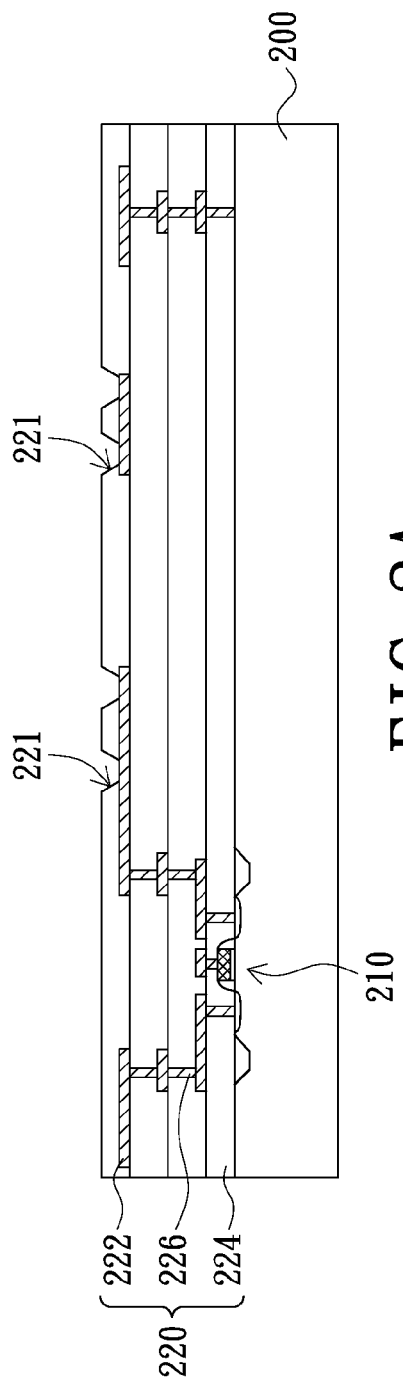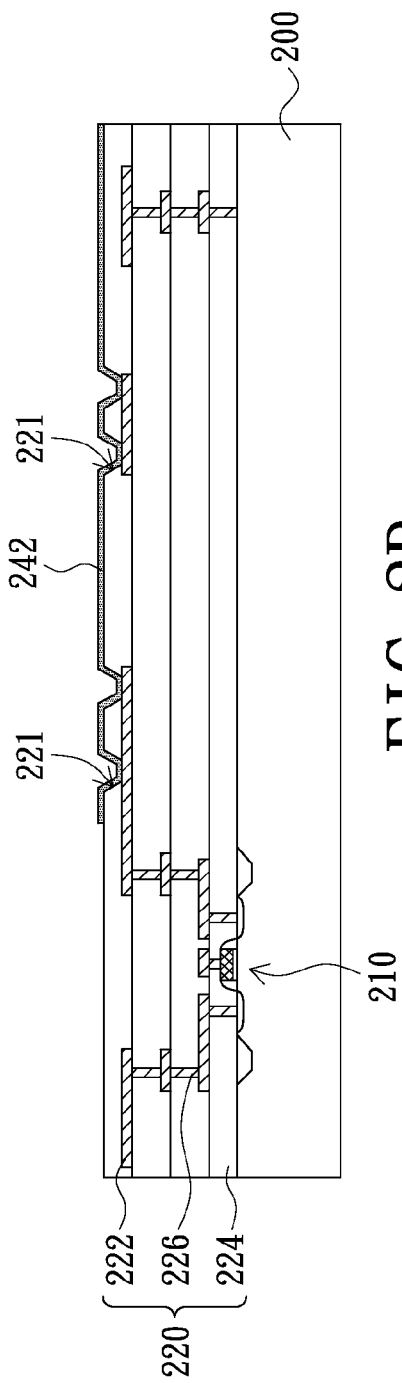

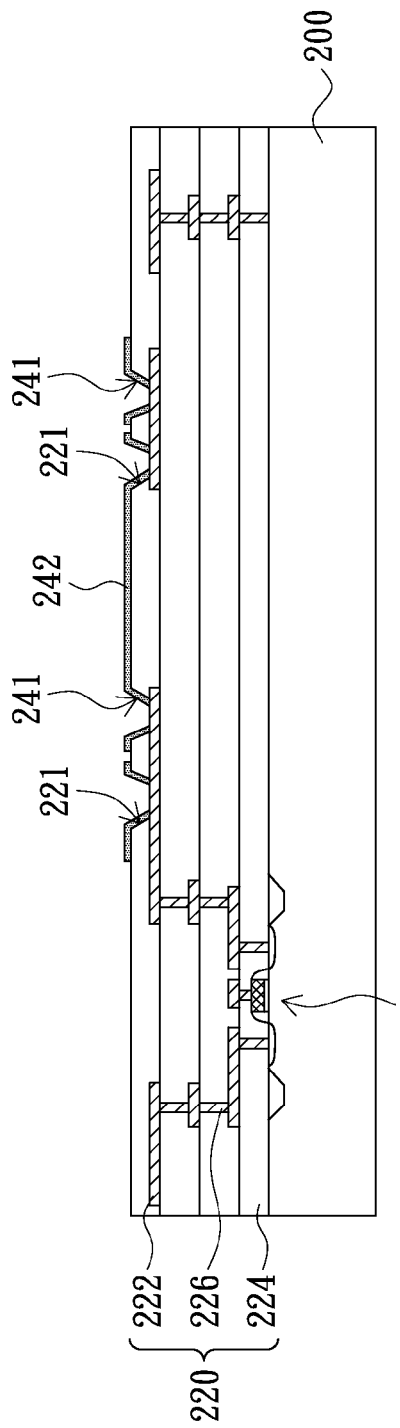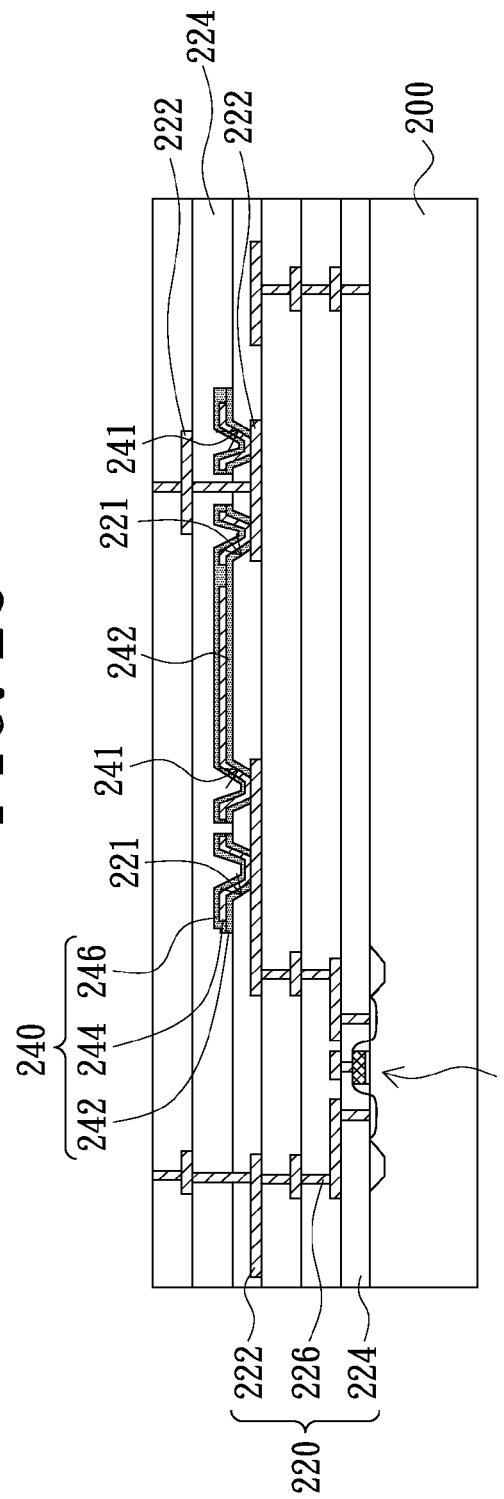
FIG. 2C
FIG. 2D

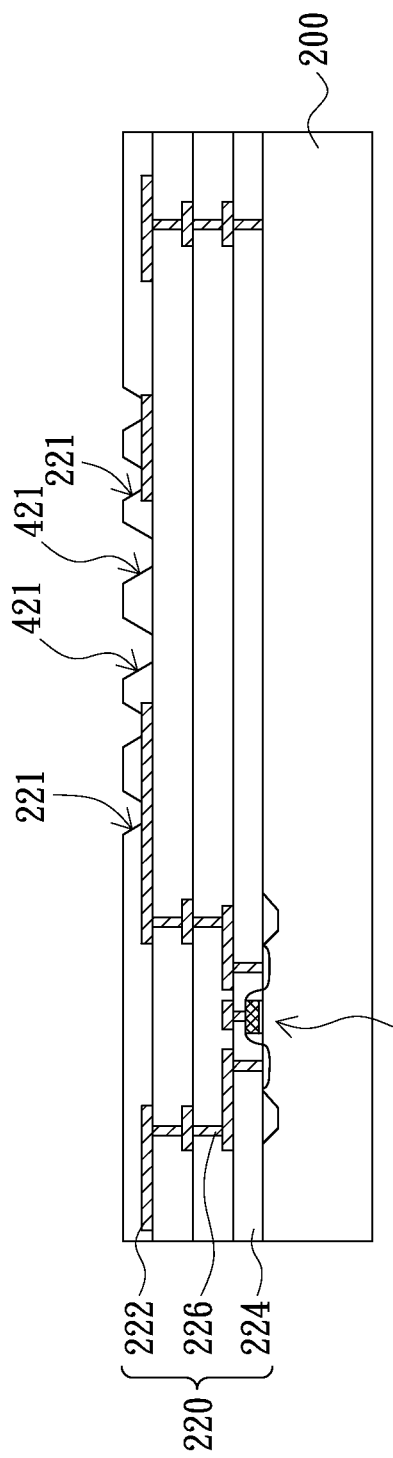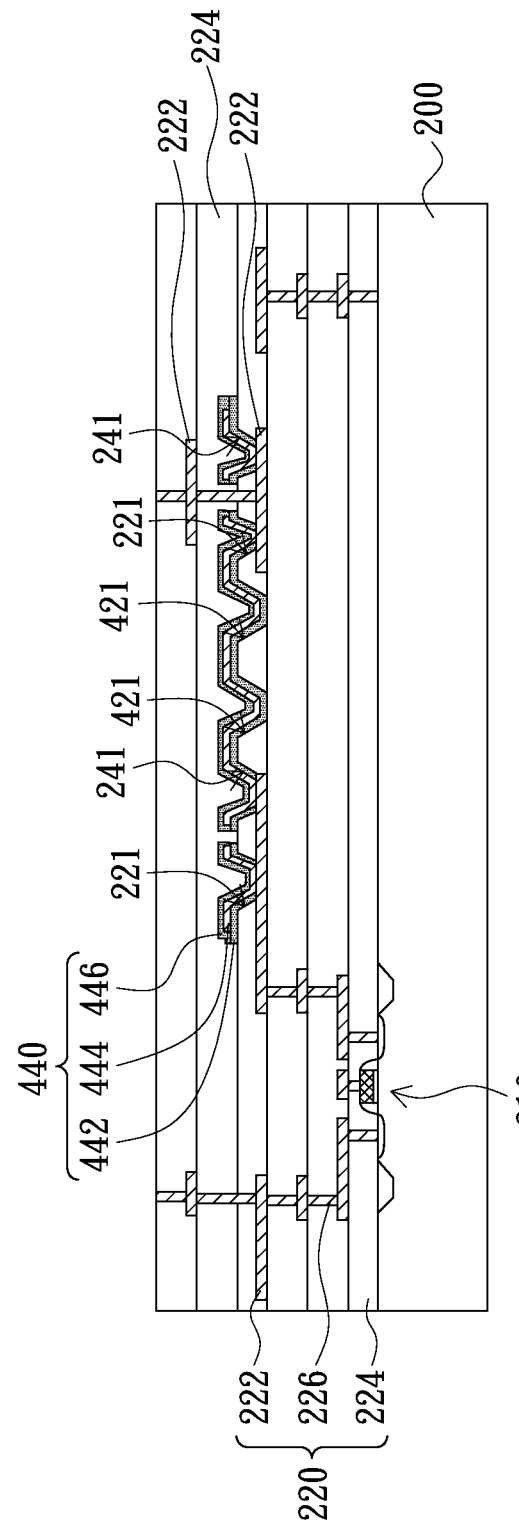

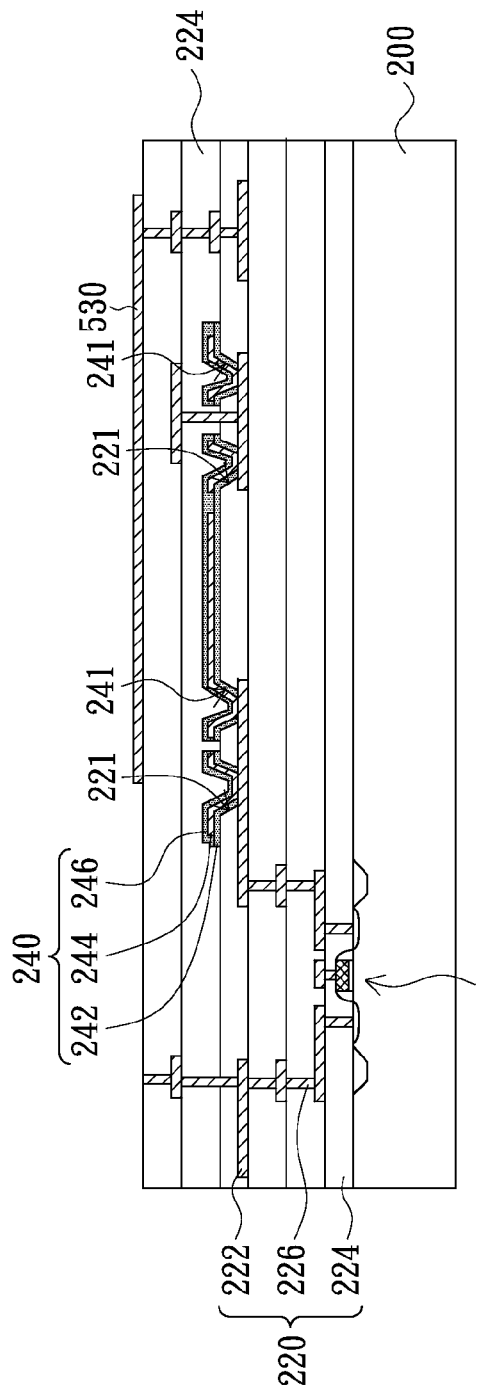
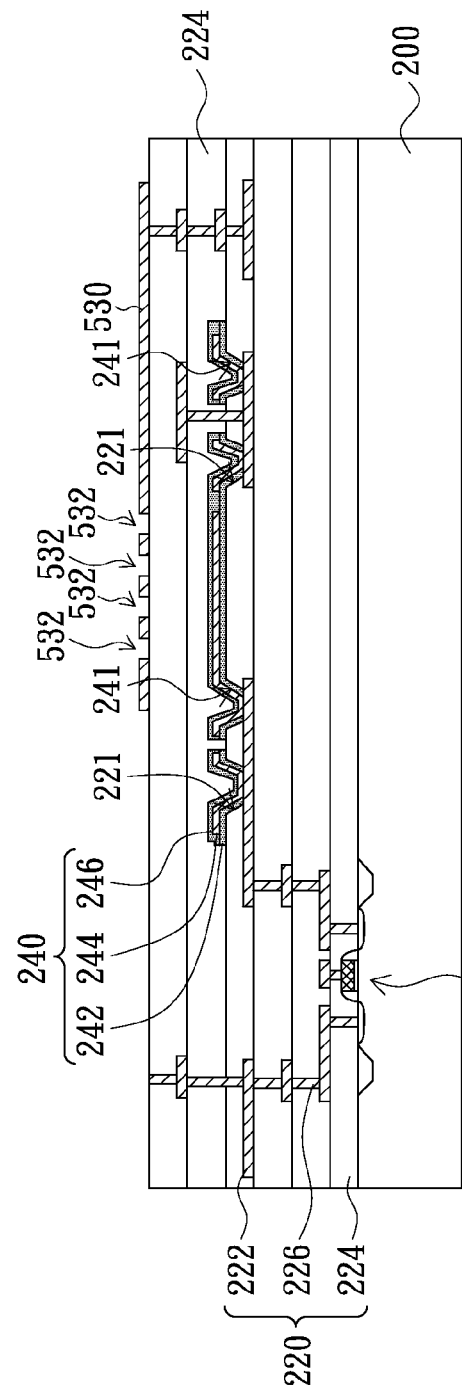
FIG. 5A
FIG. 5B

INTEGRATED CIRCUIT AND FABRICATING METHOD THEREOF

BACKGROUND

1. Technical Field

The present invention generally relates to an integrated circuit and fabricating method thereof and more particularly to an integrated circuit with a MEMS diaphragm and fabricating method thereof.

2. Description of the Related Art

Micro electromechanical system (MEMS) technique has established a whole new technical field and industry. The MEMS technique has been widely used in a variety of microelectronic devices that have electronic and mechanical properties, for example, pressure sensors, accelerators and micromicrophones.

Since the MEMS microphone has the advantages of light, small and high signal quality, it gradually becomes the mainly stream of micro microphone. Furthermore, complementary metal oxide semiconductor (CMOS) process is usually used to fabricate the MEMS for decreasing the cost and integrating the process of the MEMES and the driving circuit thereof. FIG. 1 is a schematic cross-sectional view of the conventional MEMS microphone. Referring to FIG.1, the MEMS microphone 100 includes a conductive substrate 110, an metal oxide semiconductor device 120, an interconnecting structure 130 and a MEMS diaphragm 140. The metal oxide semiconductor device 120 and the interconnecting structure 130 are formed on the conductive substrate 110, and the interconnecting structure 130 includes a plurality of wires 132, a plurality of contact vias 134 and a plurality of dielectric layers 136. The MEMS diaphragm 140 is disposed between the wires belong two adjacent layers and electrically connected to the wire 132 of under layer and the wire 132 of over layer through the contact vias 134.

Since the MEMS diaphragm 140 is stacked by a nitride 142, a metal 144 and a nitride 146, the depth of the contact vias 134 formed above the MEMS diaphragm 140 has to control exactly to prevent the nitride 146 from being overetching. However, during the process of tiny MEMS microphone 100, it is difficult to control the depth of the contact vias 134. Thus, the prior art also provides another MEMS diaphragm stacked by metal nitride, metal and metal nitride in sequence, wherein the metal nitride can be a etching stop layer during the process of the contact via 134. Nevertheless, the MEMS diaphragm composed of metal nitride/metal/metal nitride has larger film stress, so the performance thereof is lower than the MEMS diaphragm composed of nitride/metal/nitride.

BRIEF SUMMARY

Accordingly, the invention is directed to a method for fabricating integrated circuit to simplify process and decrease cost.

The invention is also directed to an integrated circuit which can be fabricated easily and has a MEMS diaphragm with low stress.

The invention provides a method for fabricating integrated circuit. Firstly, a silicon substrate with a logical circuit region and the MEMS region is provided. Secondly, a metal oxide semiconductor device is formed on the logical circuit region of the silicon substrate. Thirdly, an interconnecting structure is formed above the silicon substrate and electrically connected to the metal oxide semiconductor device. The interconnecting structure includes a plurality of dielectric layer and each dielectric layer is filled with at least a conductive material. Next, a MEMS diaphragm is formed between any tow adjacent dielectric layers of the interconnecting structure located on the MEMS region. During the fabricating process of the MEMS diaphragm, a plurality of first openings is formed in any one of the dielectric layers of the interconnecting structure to expose corresponding conductive materials. Next, a bottom insulating layer is formed on the dielectric layer and filling into the first openings. Then, portions of the bottom insulating layer disposed on the bottom of the first openings are removed to form at least a first trench exposing corresponding at least a portion of one of the conductive materials. After that, a first electrode layer is formed on the bottom insulating layer and filling into the first trench to electrically connect to the wire. Then, a top insulating layer is formed on the first electrode layer.

In one embodiment of the invention, the method further comprises a step of removing a portion of the dielectric layer positioned above the MEMS diaphragm to form a voice entrance exposing the MEMS diaphragm.

In one embodiment of the invention, a portion of the MEMS region of the silicon substrate is removed to form a plurality of holes for exposing a portion of the dielectric layers under the MEMS diaphragm. Next, the portion of the dielectric layers under the MEMS diaphragm is removed through the holes to form a vibration cavity between the silicon substrate and the MEMS diaphragm.

In one embodiment of the invention, a guard-ring is further formed and surrounding a portion of the dielectric layer predetermined being formed the vibration cavity on the MEMS region of the silicon substrate.

In one embodiment of the invention, at least one of the conductive materials is filled into the dielectric layer disposed above the MEMS diaphragm during the steps of forming the interconnecting structure.

In one embodiment of the invention, a second electrode layer is formed and electrically connecting to the interconnecting structure above the MEMS diaphragm. Next, a portion of the second electrode layer is removed to form a plurality of holes exposing a portion of the dielectric layers formed above the MEMS diaphragm. Then, the portion of the dielectric layers above the MEMS diaphragm is removed through the holes to form a vibration cavity between the second electrode layer and the MEMS diaphragm.

In one embodiment of the invention, a portion of the MEMS region of the silicon substrate and a portion of the dielectric layers under the MEMS diaphragm are further removed to form a voice entrance exposing a portion of the MEMS diaphragm.

In one embodiment of the invention, a guard-ring is further formed and surrounding a portion of the dielectric layer predetermined being formed the vibration cavity on the MEMS region of the silicon substrate.

In one embodiment of the invention, the first trench maybe ringlike.

In one embodiment of the invention, a plurality of second openings is further formed within the dielectric layer having the first openings before forming the MEMS diaphragm, wherein the MEMS diaphragm filling into the second openings.

The invention also provides an integrated circuit including a silicon substrate, a metal oxide semiconductor device, an interconnecting structure and a MEMS diaphragm. The silicon substrate has a logical circuit region and a MEMS region. The metal oxide semiconductor device is disposed on the logical circuit region and the interconnecting structure is disposed above the silicon substrate and electrically connecting to the metal oxide semiconductor device. In detail, the interconnecting structure includes a plurality of dielectric layers, wherein each dielectric layers is filled with at least a conductive material. The MEMS diaphragm is disposed between two adjacent dielectric layers on the MEMS region. The dielectric layer under the MEMS diaphragm has a plurality of first openings exposing corresponding portions of conductive materials. The MEMS diaphragm includes a bottom insulating layer, a first electrode layer and a top insulating layer. The bottom insulating layer covering sidewalls of the first openings has at least a first trench. The first electrode layer is disposed on the bottom insulating layer and filling into the first trench and electrically connected to the conductive materials. The top insulating layer is disposed on the first electrode layer.

The invention further provides an integrated circuit including a silicon substrate, an interconnecting structure and a MEMS diaphragm. The interconnecting structure is disposed above the silicon substrate and electrically connecting to the metal oxide semiconductor device. In detail, the interconnecting structure includes a plurality of dielectric layers, wherein each dielectric layers is filled with at least a conductive material. The MEMS diaphragm is disposed between two adjacent dielectric layers. The dielectric layer under the MEMS diaphragm has a plurality of first openings exposing corresponding portions of conductive materials. The MEMS diaphragm includes a bottom insulating layer, a first electrode layer and a top insulating layer. The bottom insulating layer covering sidewalls of the first openings has at least a first trench. The first electrode layer is disposed on the bottom insulating layer and filling into the first trench and electrically connected to the conductive materials. The top insulating layer is disposed on the first electrode layer.

In one embodiment of the invention, the silicon substrate has a plurality of holes communicating to the vibration cavity.

In one embodiment of the invention, the interconnecting structure has a voice entrance positioned above the vibration cavity and exposing a portion of the MEMS diaphragm.

In one embodiment of the invention, the interconnecting structure further comprises a guard-ring disposed under the MEMS diaphragm and surrounding the vibration cavity.

In one embodiment of the invention, the integrated circuit further comprises a second electrode layer electrically connecting to the interconnecting structure and disposed above the MEMS diaphragm and separated from the MEMS diaphragm by a vibration cavity.

In one embodiment of the invention, the second electrode layer has a plurality of holes communicating to the vibration cavity. Moreover, a portion of the MEMS diaphragm is exposed by the silicon substrate.

In one embodiment of the invention, the interconnecting structure further comprises a guard-ring disposed above the MEMS diaphragm and surrounding the vibration cavity.

In one embodiment of the invention, the first trench may be ringlike.

In one embodiment of the invention, the MEMS diaphragm is flat or curviform.

In one embodiment of the invention, wherein at least one of the conductive materials is disposed above the MEMS diaphragm.

The MEMS diaphragm of the integrated circuit of the invention is connected with the conductive materials of under layer through the openings formed in the dielectric layer and can be connected to the conductive materials of over layer through the conductive materials of under layer. Therefore, the integrated circuit of the invention can use the stacked layer composed of nitride/metal/nitride as the MEMS diaphragm to improve the performance of the integrated circuit. Furthermore, since it is unnecessary to form contact vias above the MEMS diaphragm during the fabricating process of the integrated circuit of the invention, the process may be simplified and the cost may be decreased.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 2A through FIG. 2E are schematic cross-sectional views illustrating parts of fabricating process steps of an integrated circuit in accordance with an embodiment of the present invention.

FIG. 4A through FIG. 4C are schematic cross-sectional views illustrating parts of fabricating process steps of an integrated circuit in accordance with another embodiment of the present invention.

FIG. 5A through FIG. 5C are schematic cross-sectional views illustrating parts of fabricating process steps of an integrated circuit in accordance with another embodiment of the present invention.

DETAILED DESCRIPTION

The integrated circuit of the invention is fabricated by CMOS process. A MEMS microphone integrated to a CMOS circuit would be described as examples in the following embodiments, but the invention is not limited hereto. Those skilled in the art should know that the invention also can be applied in a MEMS structure without CMOS circuit.

Figure 1:
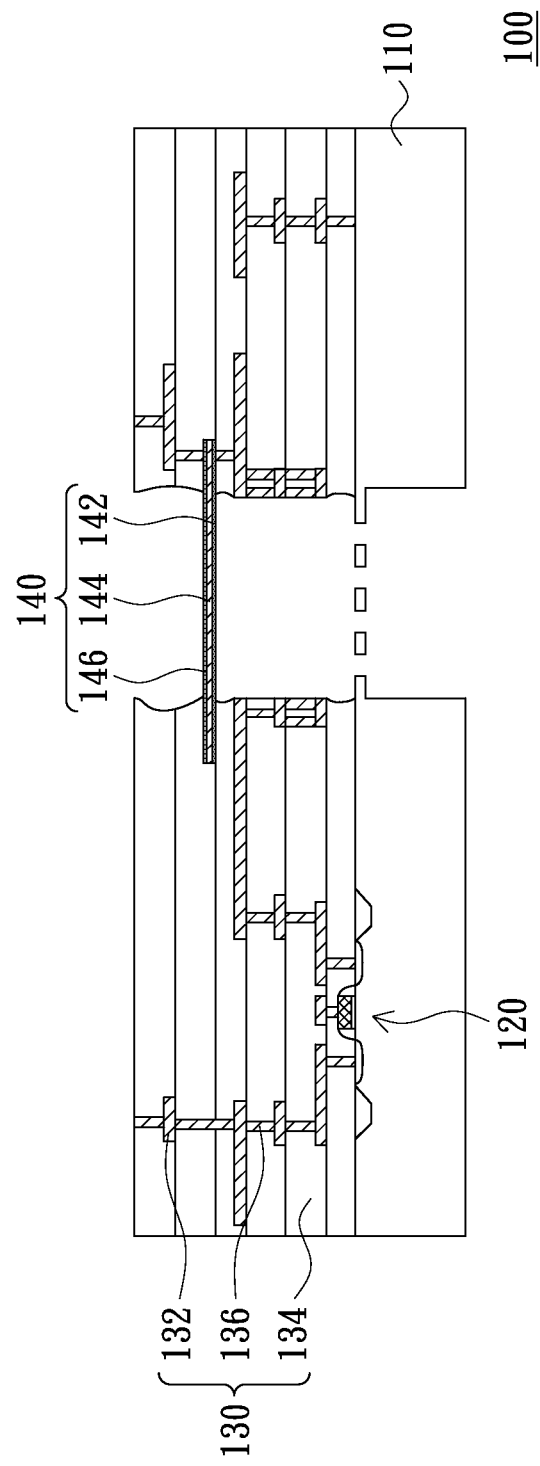
FIG. 1 is a schematic cross-sectional view of the conventional MEMS microphone.
Figure 2E:
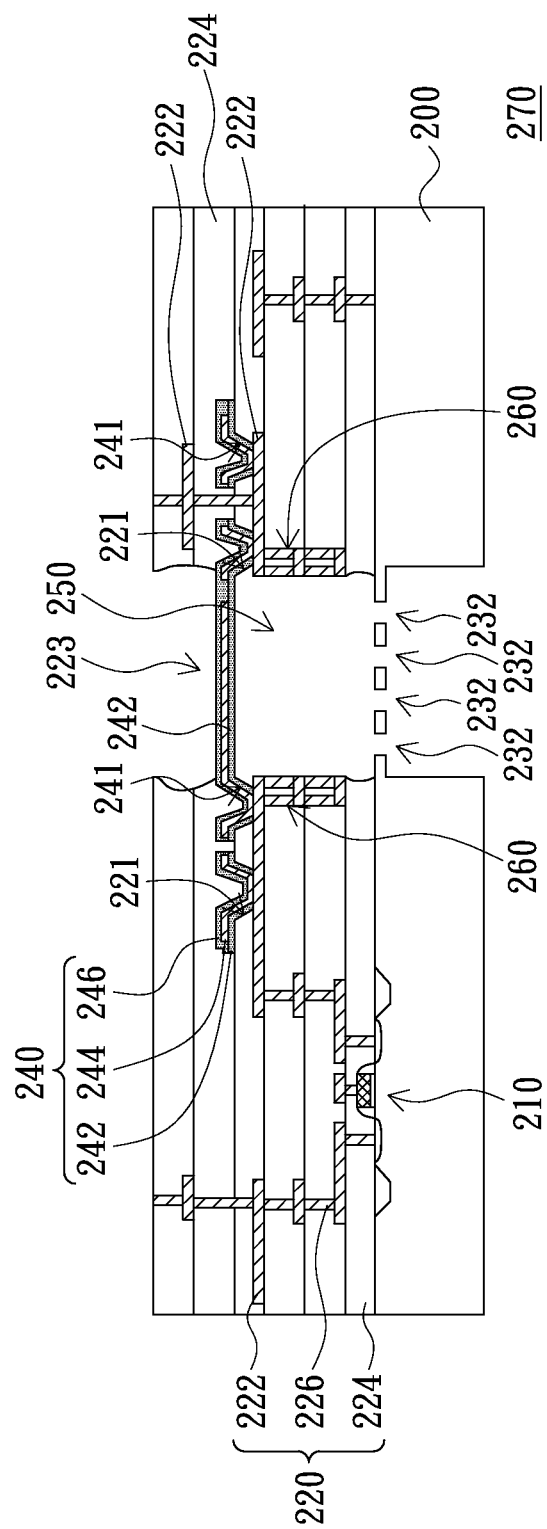

FIG. 2A through FIG. 2E are schematic cross-sectional views illustrating parts of fabricating process steps of an integrated circuit in accordance with an embodiment of the present invention. Referring to FIG. 2A, a silicon substrate 200 has a logical circuit region 202 and a MEMS region 204 is provided and a metal oxide semiconductor device 210 is formed on the logical circuit region 202. Next, an interconnecting structure 220 including a plurality of dielectric layers 224 is formed above the silicon substrate 200. Each dielectric layers 224 is filled with at least a conductive material. In detail, the conductive materials of this embodiment can be wires 222 and contact vias 226. The wires 222 formed in two adjacent layers are electrically connected to each other by the contact vias 226 formed in the dielectric layer 224. Further, at least a portion of the wires 222 is electrically connected to the metal oxide semiconductor device 210 through the contact vias 226.

Referring to the FIG. 2A again, a plurality of first openings 221 are formed in one of the dielectric layers 224 during the forming process of the interconnecting structure 220 to expose the corresponding wires 222. In this embodiment, the first openings 221 may be ringlike, but the invention is not limited hereto. Referring to the FIG. 2B, a bottom insulating layer 242 is formed on the dielectric layer 224 and filling into the first openings 221. In specific, the material of the bottom insulating layer 242 is, for example, nitride.

Referring to the FIG. 2C, the portions of the bottom insulating layer 242 located on the bottom of the first openings 221 are removed and the other portions of the bottom insulating layer 242 located on sidewalls of the first openings 221 are remained. Therefore, at least a first trench 241 may be formed in the bottom insulating layer 242 and exposing the corresponding wires 222. It should be note that since the first openings 221 of this embodiment are ringlike, the first trench 241 formed in the first opening is also ringlike.

Referring to FIG. 2D, a first electrode layer 244 is formed on the bottom insulating layer 242 and filling into the first trench 241. Therefore, the first electrode layer 244 is electrically connected to the wires 222 exposed by the first trench 241. Then, a top insulating layer 246 is formed on the first electrode layer 244. Specifically, the material of the first electrode layer 244 is, for example, aluminum or other material with high conductivity. Additionally, the material of the top insulating layer 246 is, for example, nitride such that a sandwich MEMS diaphragm 240 as nitride/metal/nitride are composed of the bottom insulating layer 242, the first electrode layer 244 and the top insulating layer 246 compose.

Figure 3:
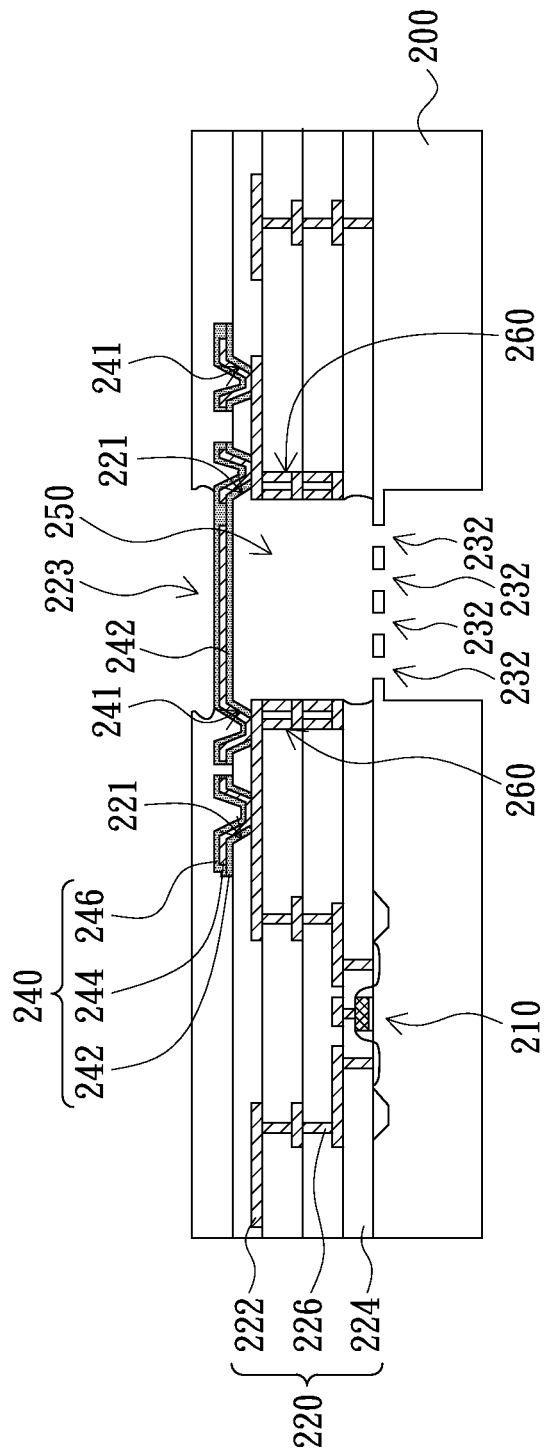
FIG. 3 is a schematic cross-sectional view of an integrated circuit in accordance with another embodiment of the present invention.

After forming the MEMS diaphragm 240, at least one of the dielectric layers 224 is formed on the MEMS diaphragm 240 to finish the process of the interconnecting structure 220. That is, the invention inset the steps of forming MEMS diaphragm 240 into the process of the interconnecting structure 220 for forming the MEMS diaphragm 240 between the any two adjacent dielectric layers 224 of the interconnecting structure 220. Specially, the MEMS diaphragm 240 of this embodiment is also disposed between wires 222 of two adjacent layers, but the invention is not limited hereto. The MEMS diaphragm 240 is also can be formed above the wire 222 of the top layer of the interconnecting structure 220, as shown in FIG. 3.

Referring to FIG. 2E, after forming the interconnecting structure 220, a portion of the dielectric layers 224 located above the MEMS diaphragm 240 is removed to form a voice entrance 223 exposing the MEMS diaphragm 240. Also, a portion of the silicon substrate 200 under the MEMS diaphragm 240 is removed to form a plurality of holes. Next, a portion of the dielectric layer 224 under the MEMS diaphragm 240 is removed through the holes 232. In detail, the portion of the silicon substrate 200 is removed by dry etch, such as deep reactive ion etching, (DRIE). Then, the portion of the dielectric layer 224 under the MEMS diaphragm 240 is removed by vapor of hydrogen fluoride through the holes 232. Therefore, a vibration cavity 250 may be formed between the MEMS diaphragm 240 and the silicon substrate 200. At this time, an integrated circuit 270 is substantially made. In this embodiment, the integrated circuit 270 is, for example, a MEMS microphone.

Furthermore, a guard-ring 260 is formed on the MEMS region 204 of the silicon substrate 200 and surrounding a portion of the dielectric layer 224 predetermined being formed the vibration cavity 250 during the process of the interconnecting structure 220. In specific, the guard-ring 260 is stacked by metal films such as tungsten or other metals. Therefore, the dielectric layer 224 can prevent from being over-etching while the portion of the dielectric layer 224 under the MEMS diaphragm 240 is removed by hydrogen fluoride.

As the aforementioned, the voice entrance 223 of this embodiment is provided for making the voice signal pass through. Therefore, the MEMS diaphragm 240 is subjected to the pressure provided by the voice signal and results in vibration, wherein the bottom insulating layer 242 and the top insulating layer 246 are mainly vibrating films. Since the distance between the MEMS diaphragm 240 and the second electrode layer 230 may be varied according the vibration of the MEMS diaphragm 240, the value of the voice signal may be calculated according to the variation of the capacitance between the first electrode layer 244 of the MEMS diaphragm 240 and the second electrode layer 230.

Specially, although the MEMS diaphragm 240 of the mentioned embodiment is flat, but the shape of the MEMS diaphragm of the invention is not limited hereto. In another embodiment, the MEMS diaphragm 240 may be curviform. The difference between the aforementioned embodiment and the fabricating process of an integrated circuit having a curviform MEMS diaphragm would be described in the following paragraphs.

Figure 4C:
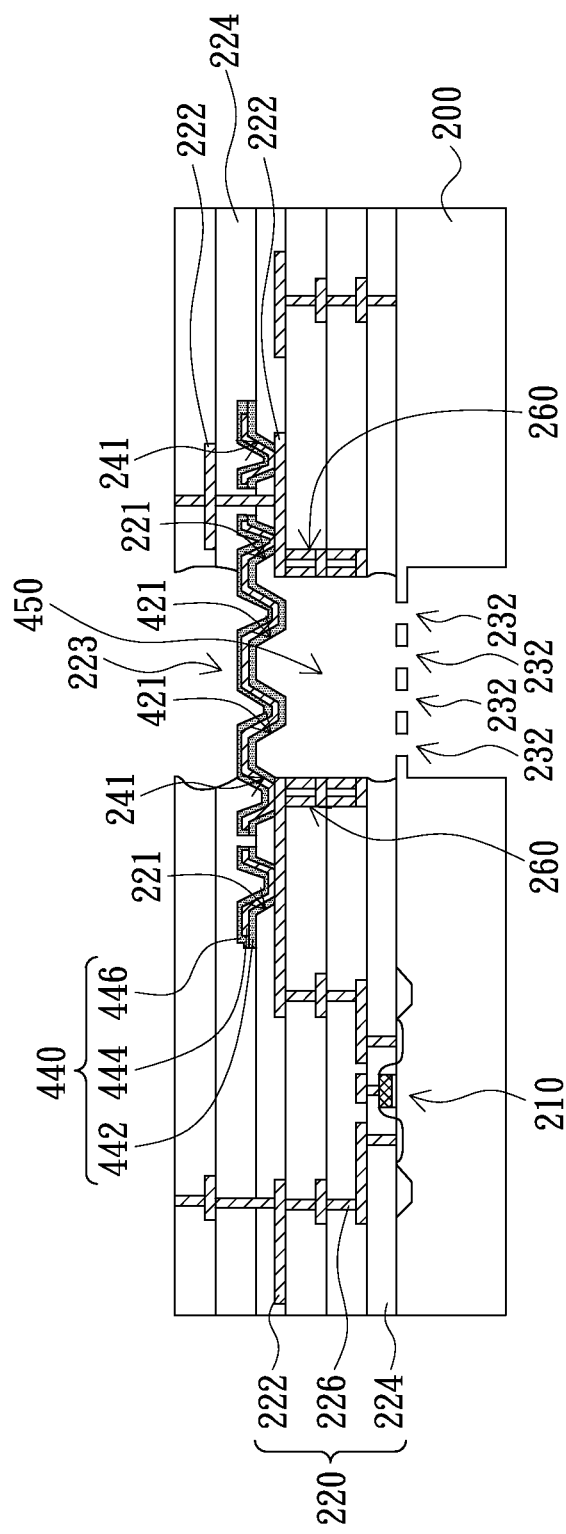

FIG. 4A through FIG. 4C are schematic cross-sectional views illustrating parts of fabricating process steps of an integrated circuit in accordance with another embodiment of the present invention. Referring to FIG. 4A, a plurality of second openings 421 are formed in the dielectric layer 224 with the first openings 221 simultaneously. Next, referring to FIG. 4B, a bottom insulating layer 442 is formed on the dielectric layer 224 and the portion of the bottom insulating layer 242 located on the bottom of the first openings 221 is removed to expose the corresponding wire 222. Then, a first electrode layer 444 and a top insulating layer 446 are formed in sequence on the bottom insulating layer 442 to compose a MEMS diaphragm 440. It should be note that the MEMS diaphragm 440 is filled into the second openings 421 so as to present curviform. Moreover, the material of the MEMS diaphragm 440 is the same or similar to the MEMS diaphragm 240 of the aforementioned embodiment. After forming the MEMS diaphragm 440, at least one of the dielectric layers 224 of the interconnecting structure 220 is formed above the MEMS diaphragm 440. Such that, the process of the interconnecting structure 220 is finished.

Referring FIG. 4C, portions of the dielectric layers 224 located above the MEMS diaphragm 440 is removed to form the voice entrance 223 exposing the MEMS diaphragm 440. Further, a portion of the dielectric layer 224 under the MEMS diaphragm 440 is also removed to form a vibration cavity 450 between the silicon e substrate 200 and the MEMS diaphragm 440. The method for forming the voice entrance 223 and the vibration cavity 450 is the same or similar to the aforementioned embodiment.

When a voice signal passes through the voice entrance 223 and applies pressure to the MEMS diaphragm 440, the MEMS diaphragm 440 would vibrate and the capacity between the first electrode layer 444 of the MEMS diaphragm 440 and the silicon substrate 200 would be varied according to the vibration of the MEMS diaphragm 440, and then the variation of capacity is transmitted to the metal oxide semiconductor device 210 through the interconnecting structure 220 for calculating the value of the voice signal. Especially, since the curviform MEMS diaphragm 440 has low stress, it can prevent from being damaged by the pressure provided by the voice signal.

Figure 5C:
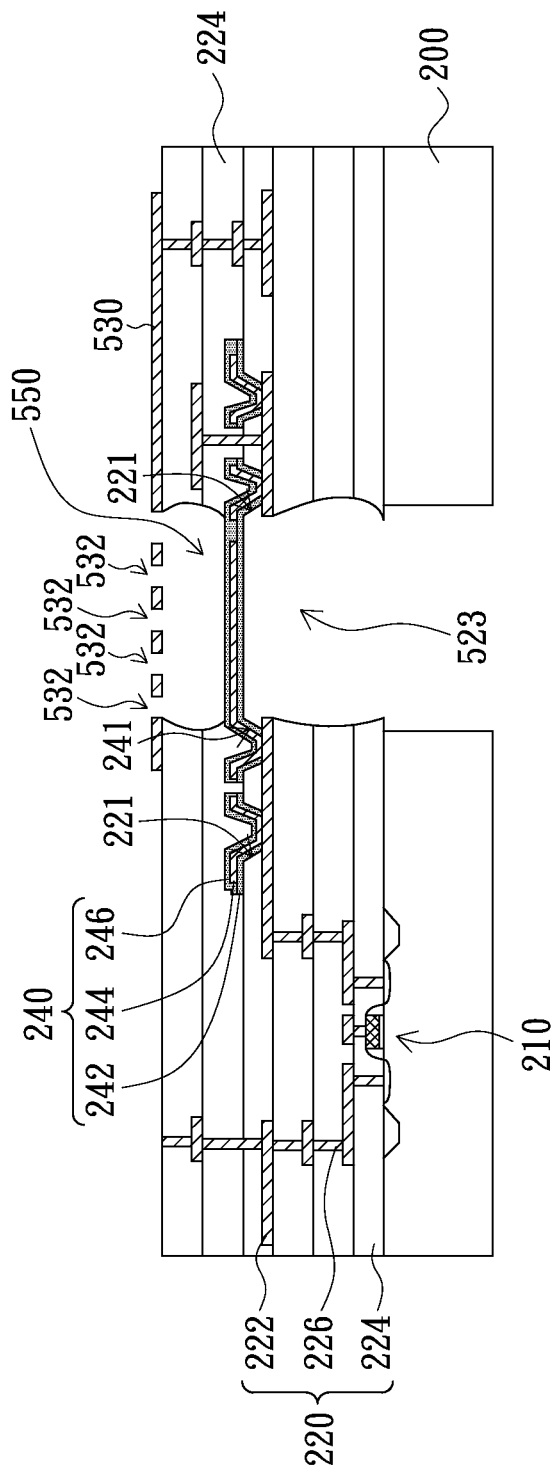

It should be note that the silicon e substrate 200 is used as a backplate electrode of the integrated circuit 270 in the aforementioned embodiment, but the invention is not limited hereto. FIG. 5A through FIG. 5C are schematic cross-sectional views illustrating parts of fabricating process steps of an integrated circuit in accordance with another embodiment of the present invention. Referring to FIG. 5A, after forming the MEMS diaphragm 240, a second electrode layer 530 is formed above the MEMS diaphragm 240. In specific, the second electrode layer 530 is electrically connected to the interconnecting structure 220 and separated from the MEMS diaphragm 240 by at least one of the dielectric layers 224. In this embodiment, the second electrode layer 530 can be a complex layer composed of nitride and metal. For example, the second electrode layer 530 of this embodiment is a complex layer of nitride/metal/nitride layer. Furthermore, the second electrode layer 530 also may compose of poly-silicon.

Next, referring to FIG. 5B, a portion of the second electrode layer 530 is removed to form a plurality of holes 532 exposing a portion of the dielectric layers 224 between the MEMS diaphragm 240 and the second electrode layer 530. Referring to FIG. 5C, a portion of the dielectric layer 224 above the MEMS diaphragm 240 is removed through the holes. Accordingly, a vibration cavity 550 is formed between the MEMS diaphragm 240 and the second electrode layer 430. Further, a portion of the dielectric layer 224 and a portion of the MEMS region 204 of the silicon substrate 200 under the MEMS diaphragm 240 are also removed to form a voice entrance 223 exposing a portion of the MEMS diaphragm 240.

In summary, the MEMS diaphragm of the invention is formed between two adjacent dielectric layers of the interconnecting structure. In the steps of forming the MEMS diaphragm, a plurality of first openings are formed in one of the dielectric layers of the interconnecting structure to expose corresponding wire of under layer. Next, the MEMS diaphragm is formed on the dielectric layer and filling into the first openings of the dielectric layer to make sure the first electrode layer of the MEMS diaphragm is electrically connected to the wire of under layer exposed by the first openings.

Moreover, even the MEMS diaphragm is necessary to electrically connect with the wire thereabove, it is no need to form contact via between the MEMS diaphragm and the wire of over layer for connecting them. The MEMS diaphragm can electrically connect to the wire of under layer through the first openings of the dielectric layer, and then can electrically connect to the wire of over layer by connecting the wire of under layer through the contact via to the wire of the over layer. Therefore, the integrated circuit of the invention may use the stacked layer of nitride/metal/nitride with low stress as the MEMS diaphragm so as to improve the performance thereof. Furthermore, in the process of the integrated circuit of the invention, it is unnecessary to form contact via above the MEMS diaphragm, so the fabricating process of the integrated circuit can be simplified and the cost can be decreased.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An integrated circuit, comprising:
   a silicon substrate with a logical circuit region and a micro electromechanical system (MEMS) region;
   a metal oxide semiconductor device disposed on the logical circuit region of the silicon substrate;
   an interconnecting structure disposed above the silicon substrate and electrically connected with the metal oxide semiconductor device, the interconnecting structure comprises a plurality of dielectric layers, wherein each dielectric layer filled with the at least a conductive material; and
   a MEMS diaphragm disposed between any two adjacent dielectric layers located on the MEMS region, wherein the dielectric layer under the MEMS diaphragm has a plurality of first openings exposing corresponding conductive materials, the MEMS diaphragm comprising:
      a bottom insulating layer covering sidewalls of the first opening and having at least a first trench;
      a first electrode layer disposed on the bottom insulating layer and filling into the first trench to electrically connect with the corresponding conductive materials; and
      a top insulating layer disposed on the first electrode layer.

2. The integrated circuit as claimed in claim 1, wherein the silicon substrate has a plurality of holes communicating to a vibration cavity, and the interconnecting structure has a voice entrance located above the vibration cavity and exposing a portion of the MEMS diaphragm.

3. The integrated circuit as claimed in claim 1, wherein the interconnecting structure further comprises a guard-ring disposed under the MEMS diaphragm and surrounding the vibration cavity.

4. The integrated circuit as claimed in claim 1, wherein the MEMS diaphragm is flat or curviform.

5. The integrated circuit as claimed in claim 1, further comprising a second electrode layer electrically connecting to the interconnecting structure and disposed above the MEMS diaphragm so as to form a vibration cavity therebetween, the second electrode layer has a plurality of holes communicating to the vibration cavity and the MEMS diaphragm exposed by the silicon substrate.

6. The integrated circuit as claimed in claim 5, wherein the interconnecting structure further comprises a guard-ring disposed above the MEMS diaphragm and surrounding the vibration cavity.

7. An integrated circuit, comprising:
   a silicon substrate;
   an interconnecting structure disposed above the silicon substrate and comprising a plurality of dielectric layers, wherein each dielectric layer filled with the at least a conductive material; and
   a micro electromechanical system (MEMS) diaphragm disposed between any two adjacent dielectric layers, wherein the dielectric layer under the MEMS diaphragm has a plurality of first openings exposing corresponding conductive materials, the MEMS diaphragm comprising:
      a bottom insulating layer covering sidewalls of the first opening and having at least a first trench;
      a first electrode layer disposed on the bottom insulating layer and filling into the first trench to electrically connect with the corresponding conductive materials; and
      a top insulating layer disposed on the first electrode layer.

8. The integrated circuit as claimed in claim 7, wherein the silicon substrate has a plurality of holes communicating to a vibration cavity and the interconnecting structure has a voice entrance located above the vibration cavity and exposing a portion of the MEMS diaphragm.

9. The integrated circuit as claimed in claim 7, wherein the interconnecting structure further comprises a guard-ring disposed under the MEMS diaphragm and surrounding the vibration cavity.

10. The integrated circuit as claimed in claim 7, wherein the MEMS diaphragm is flat or curviform.

11. The integrated circuit as claimed in claim 7, further comprising a second electrode layer electrically connecting to the interconnecting structure and disposed above the MEMS diaphragm so as to form a vibration cavity therebetween, the second electrode layer has a plurality of holes communicating to the vibration cavity, the MEMS diaphragm exposed by the silicon substrate.

12. The integrated circuit as claimed in claim 11, wherein the interconnecting structure further comprises a guard-ring disposed above the MEMS diaphragm and surrounding the vibration cavity.

13. A method for fabricating an integrated circuit, comprising:
providing a silicon substrate with a logical circuit region and a micro electromechanical system (MEMS) region;
forming a metal oxide semiconductor device on the logical circuit region of the conductive substrate;
forming an interconnecting structure electrically connecting to the metal oxide semiconductor device and comprising a plurality of dielectric layers above the silicon substrate, each dielectric layer filled with the at least a conductive material;
forming a MEMS diaphragm between any two adjacent dielectric layers of the interconnecting structure on the MEMS region, wherein the steps of forming the MEMS diaphragm comprising:
forming a plurality of first openings in any dielectric layer of the interconnecting structure to expose the corresponding conductive materials;
forming a bottom insulating layer on the dielectric layer to fill into the first openings;
removing a portion of the bottom insulating layer located on the bottom of the first openings to form at least a first trench exposing corresponding at least a portion of one of the conductive materials;
forming a first electrode layer on the bottom insulating layer to fill into the first trench and electrically connect to the corresponding conductive materials; and
forming a top insulating layer to cover the first electrode layer.

14. The method as claimed in claim 13, further comprising a step of removing a portion of the dielectric layer positioned above the MEMS diaphragm to form a voice entrance exposing the MEMS diaphragm.

15. The method as claimed in claim 13, further comprising the step of filling at least one of the conductive materials into one of the dielectric layers disposed above the MEMS diaphragm during the steps of forming the interconnecting structure.

16. The method as claimed in claim 13, further comprising the step of forming a plurality of second openings within the dielectric layer having the first openings before forming the MEMS diaphragm, wherein the MEMS diaphragm filling into the second openings.

17. The method as claimed in claim 13, further comprising:
removing a portion of the MEMS region of the silicon substrate to form a plurality of holes for exposing a portion of the dielectric layers under the MEMS diaphragm; and
removing the portion of the dielectric layers under the MEMS diaphragm through the holes to form a vibration cavity between the second electrode layer and the MEMS diaphragm.

18. The method as claimed in claim 17, further comprising the step of forming a guard-ring surrounding a portion of the dielectric layer predetermined being formed the vibration cavity on the MEMS region of the silicon substrate during the steps of forming the interconnecting structure.

19. The method as claimed in claim 13, further comprising:
forming a second electrode layer electrically connecting to the interconnecting structure above the MEMS diaphragm;
removing a portion of the second electrode layer to form a plurality of holes exposing a portion of the dielectric layers formed above the MEMS diaphragm;
removing the portion of the dielectric layers above the MEMS diaphragm through the holes to form a vibration cavity between the second electrode layer and the MEMS diaphragm; and
removing a portion of the MEMS region of the silicon substrate and a portion of the dielectric layers under the MEMS diaphragm to form a voice entrance exposing a portion of the MEMS diaphragm.

20. The method as claimed in claim 19, further comprising the step of forming a guard-ring surrounding a portion of the dielectric layer predetermined being formed the vibration cavity on the MEMS region of the silicon substrate during the steps of forming the interconnecting structure.

* * * * *